United States Patent
Diot et al.

(10) Patent No.: US 7,358,598 B2
(45) Date of Patent: Apr. 15, 2008

(54) PROCESS FOR FABRICATING A SEMICONDUCTOR PACKAGE AND SEMICONDUCTOR PACKAGE WITH LEADFRAME

(75) Inventors: Jean-Luc Diot, Grenoble (FR); Jerome Teysseyre, Lans En Vercors (FR)

(73) Assignee: STMicroelectronics S.A., Montrouge (FR)

( * ) Notice: Subject to any disclaimer, the term of this patent is extended or adjusted under 35 U.S.C. 154(b) by 20 days.

(21) Appl. No.: 10/827,612

(22) Filed: Apr. 19, 2004

(65) Prior Publication Data
US 2005/0017330 A1   Jan. 27, 2005

(30) Foreign Application Priority Data
Apr. 29, 2003   (FR) .................................. 03 05263

(51) Int. Cl.
    *H01L 23/495* (2006.01)
(52) U.S. Cl. .................... 257/666; 257/676; 257/677
(58) Field of Classification Search ............... 257/704, 257/666, 676, 433, 434, 435, 677
    See application file for complete search history.

(56) References Cited

U.S. PATENT DOCUMENTS

| | | | |
|---|---|---|---|
| 5,821,532 A | 10/1998 | Beaman et al. | |
| 6,268,654 B1 * | 7/2001 | Glenn et al. | 257/704 |
| 6,545,332 B2 * | 4/2003 | Huang | 257/433 |
| 6,737,736 B2 * | 5/2004 | Abe et al. | 257/676 |
| 6,869,813 B2 * | 3/2005 | Okazaki | 438/22 |
| 2002/0093026 A1 | 7/2002 | Huang | |
| 2003/0075792 A1 * | 4/2003 | Ruhland | 257/693 |

FOREIGN PATENT DOCUMENTS

| | | |
|---|---|---|
| JP | 05 291546 | 11/1993 |
| JP | 05 343655 | 12/1993 |
| JP | 06 349870 | 12/1994 |
| JP | 09 102580 | 4/1997 |

OTHER PUBLICATIONS

Preliminary French Search Report, FR 03 05263, dated Jan. 21, 2004.

* cited by examiner

*Primary Examiner*—S. V. Clark
(74) *Attorney, Agent, or Firm*—Gardere Wynne Sewell LLP

(57) ABSTRACT

A semiconductor package includes a flat metal leadframe including spaced apart portions, at least some of which constitute electrical connection leads. A filling material fills the spaces that separate the spaced apart portions of the leadframe to form a plate before fastening an integrated circuit chip to the front of the leadframe. Electrical connections are made between the chip and the electrical connection leads. The chip is then encapsulated on the front of the leadframe using a formed or attached encapsulant.

10 Claims, 7 Drawing Sheets

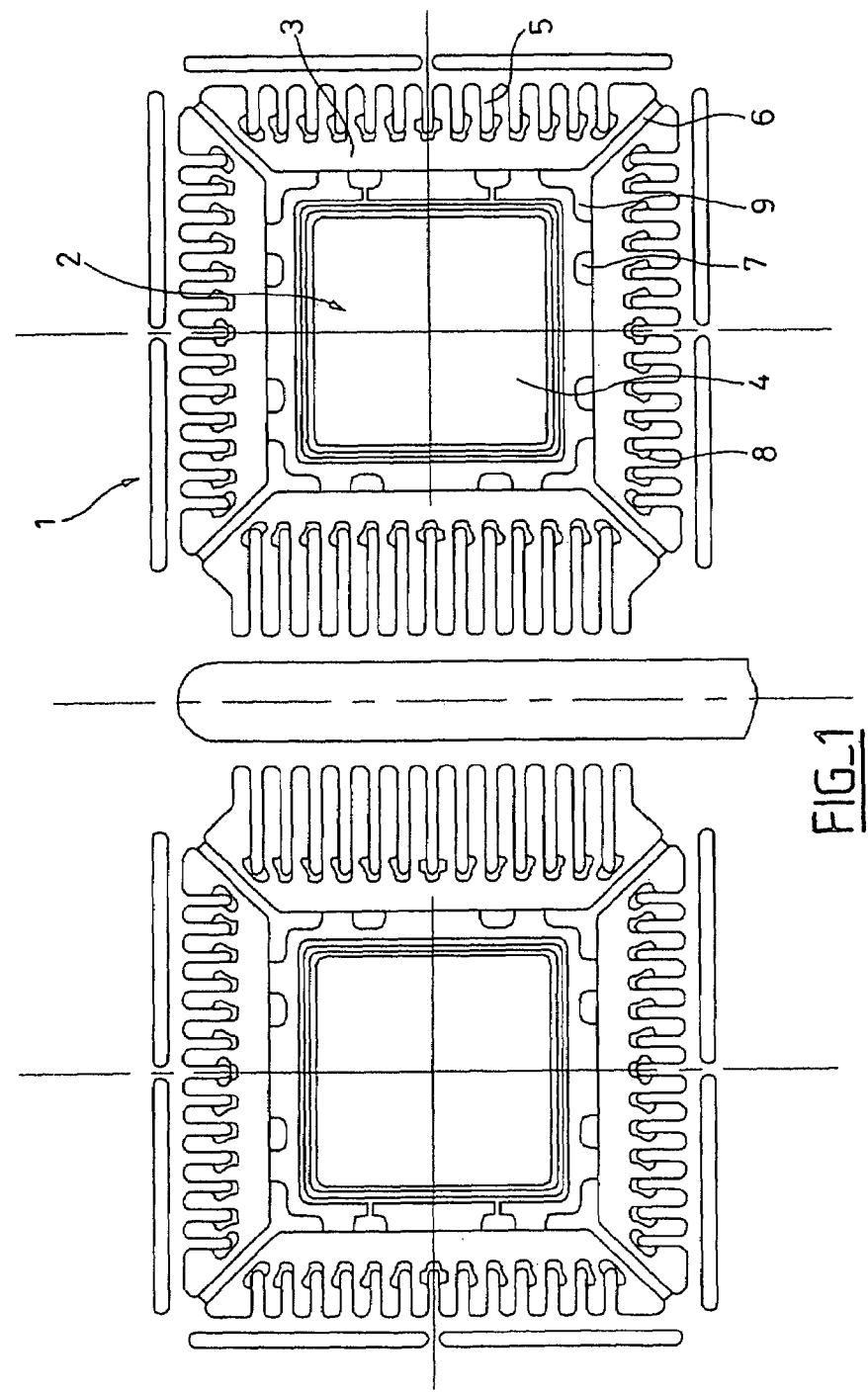
FIG_1

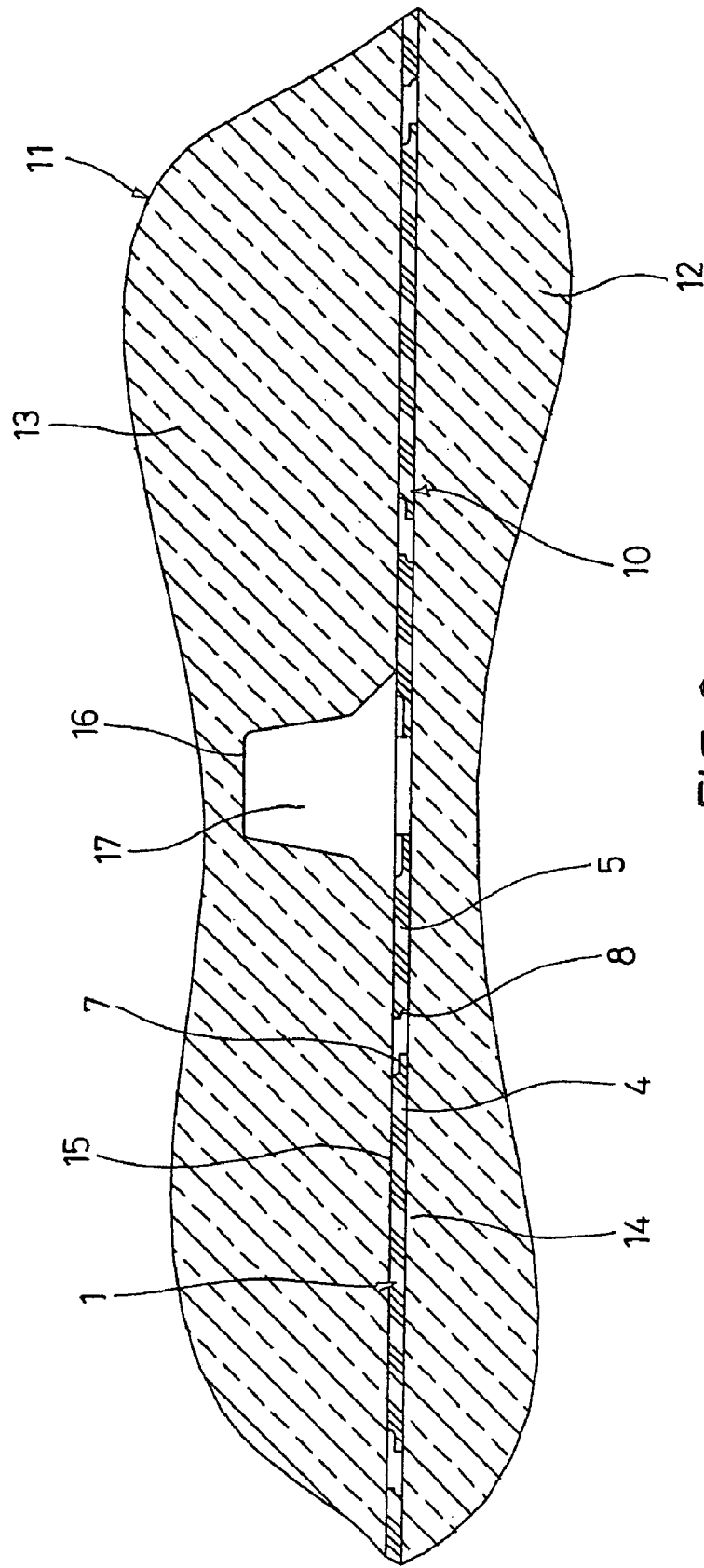
FIG_2

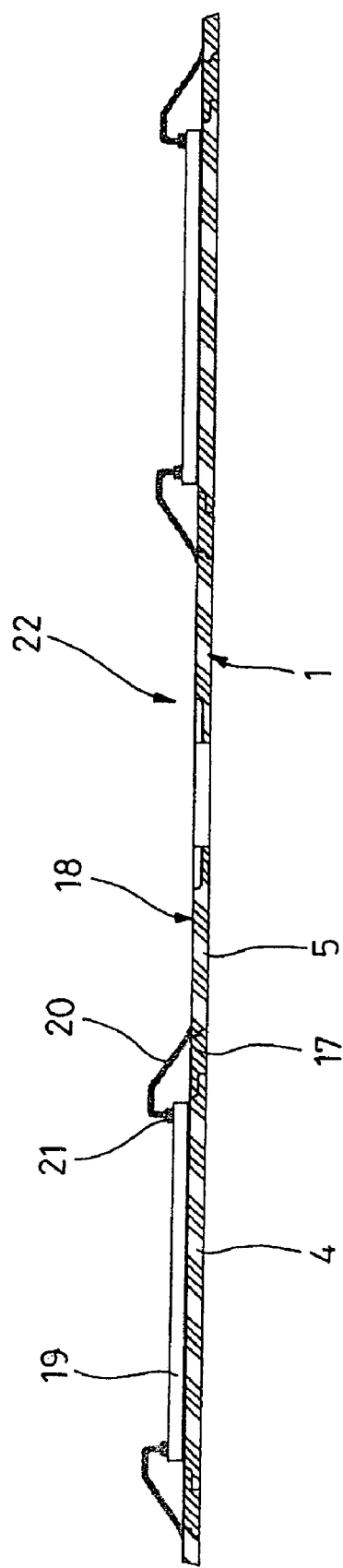
FIG_3

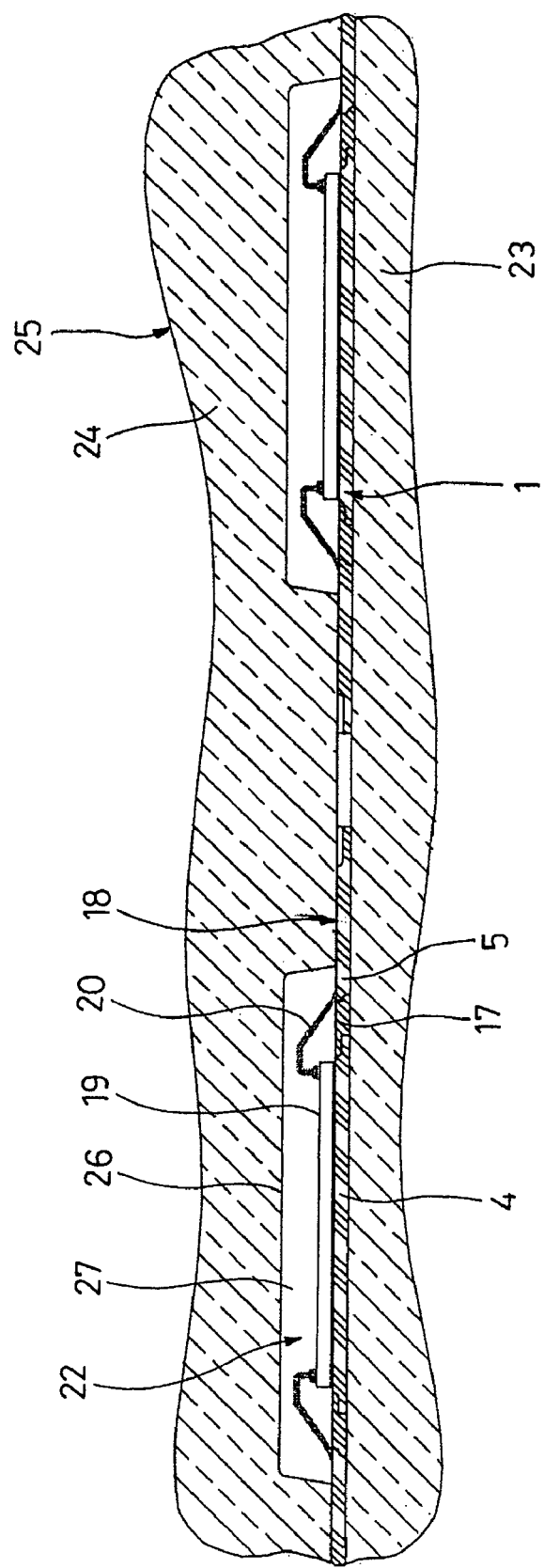
FIG_4

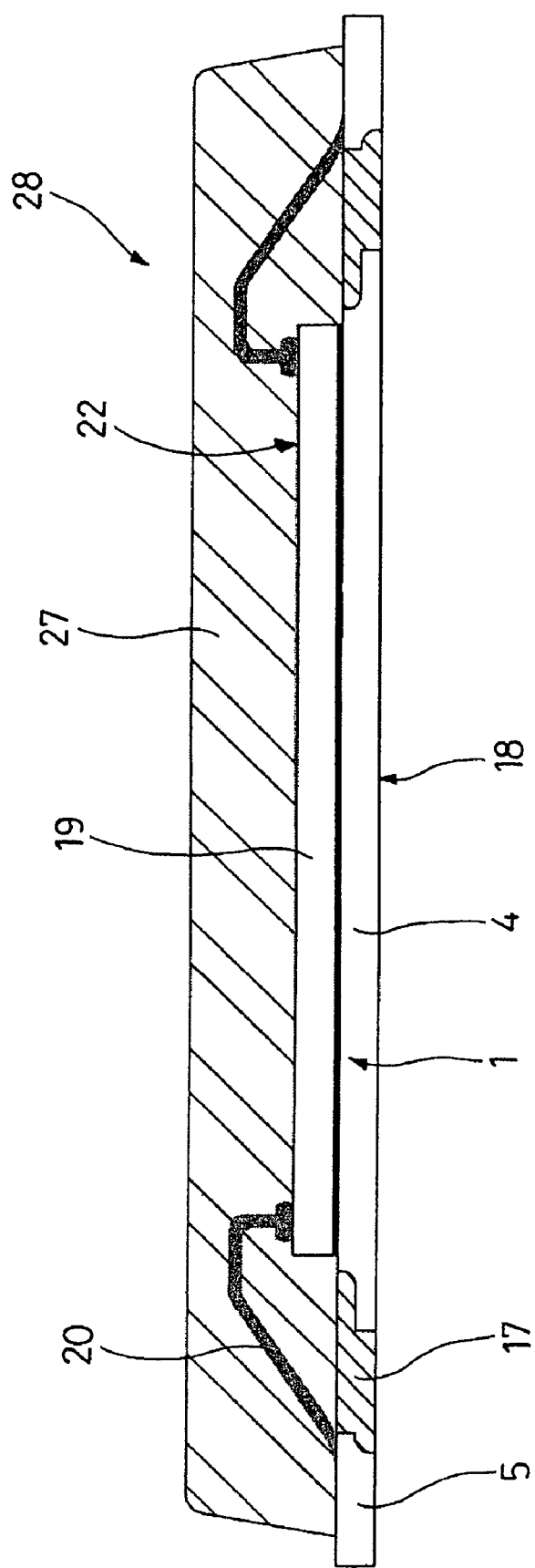
FIG_5

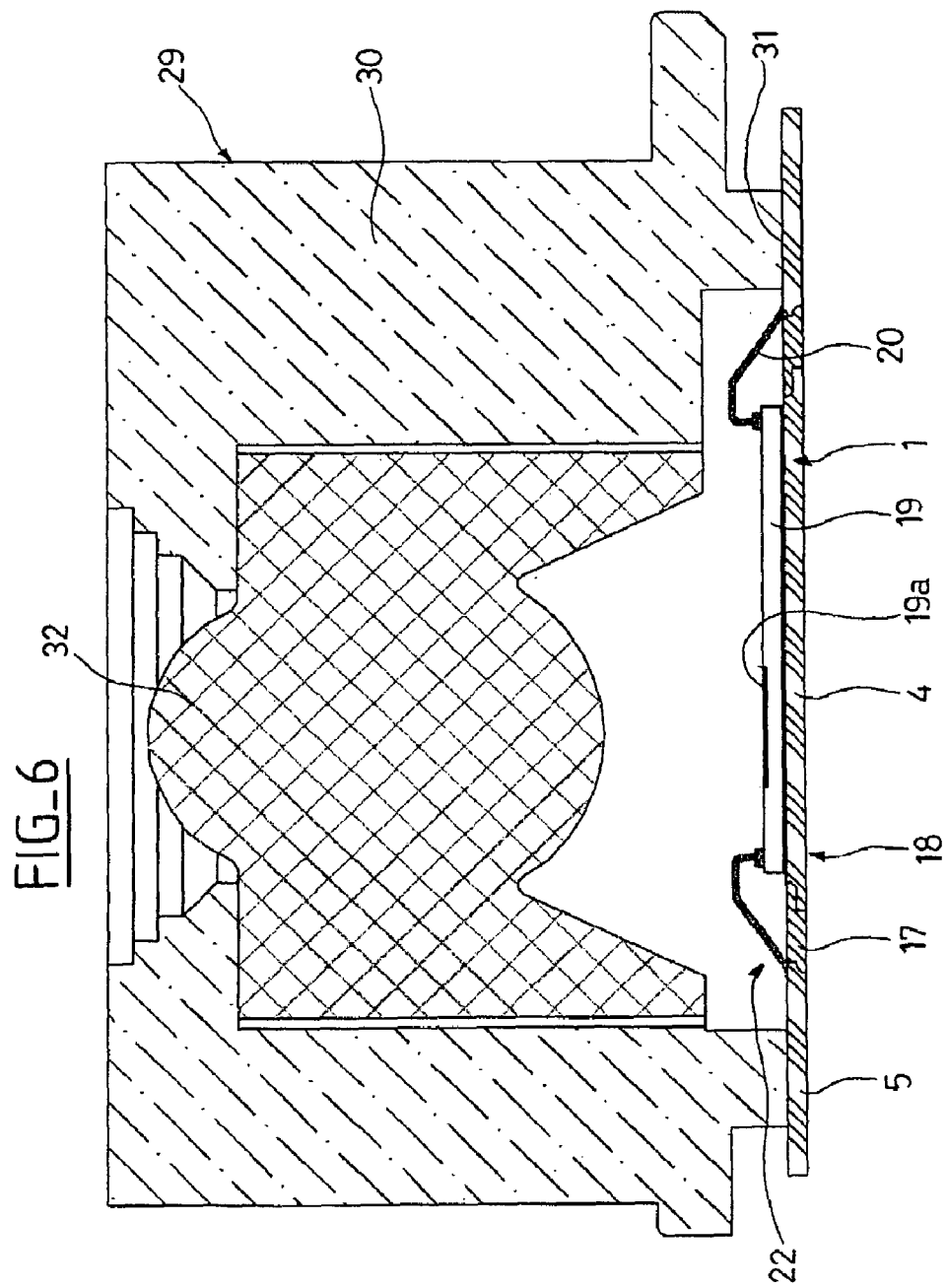

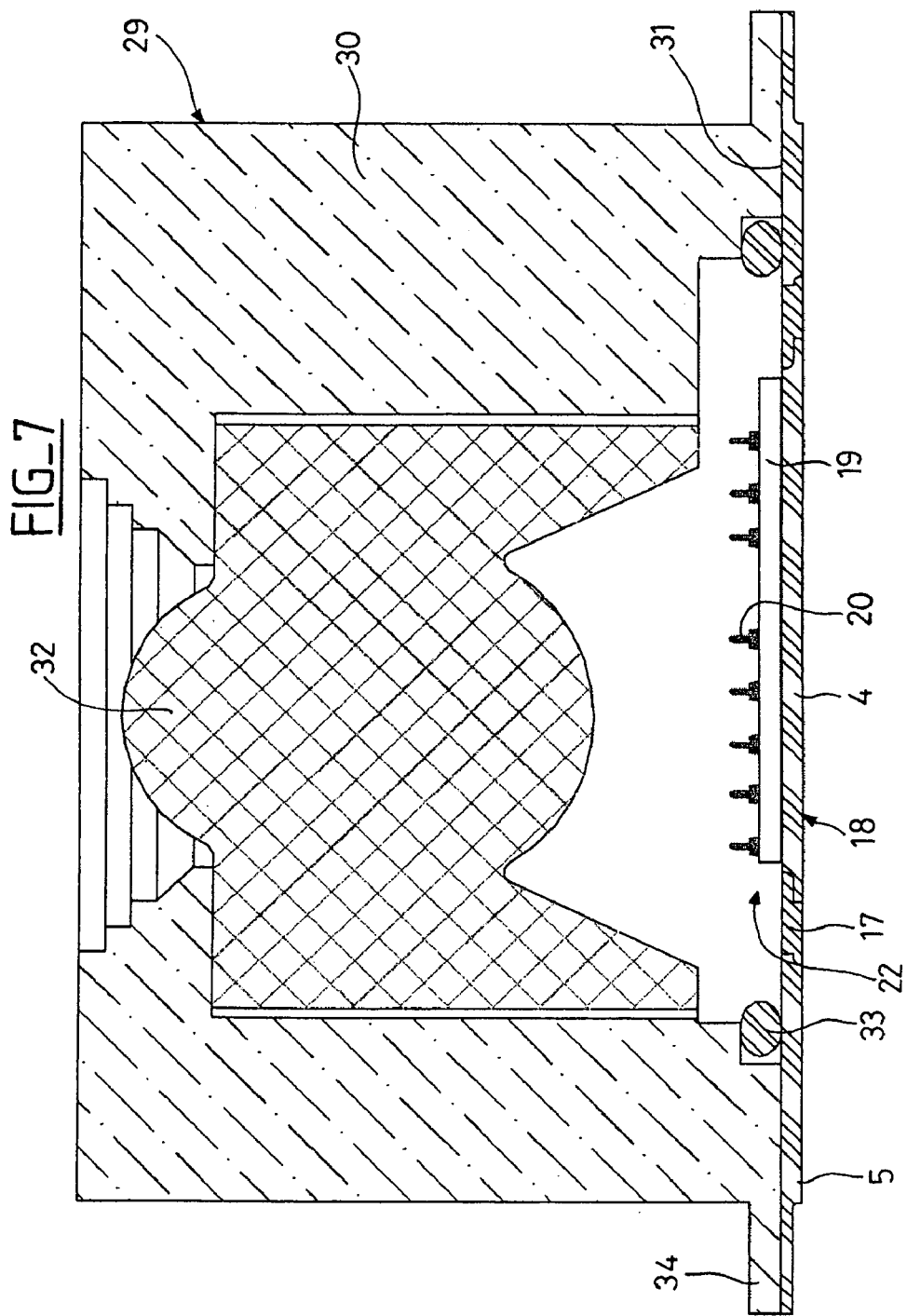
FIG_7

PROCESS FOR FABRICATING A SEMICONDUCTOR PACKAGE AND SEMICONDUCTOR PACKAGE WITH LEADFRAME

PRIORITY CLAIM

The present application claims priority from French Application for Patent No. 03 055263 filed Apr. 29, 2003, the disclosure of which is hereby incorporated by reference.

BACKGROUND OF THE INVENTION

1. Technical Field of the Invention

The present invention relates to the field of semiconductor packages and their fabrication.

2. Description of Related Art

A known semiconductor package comprises perforated flat metal leadframe having a central platform and radiating electrical connection leads distributed around and at a certain distance from this platform. An integrated circuit chip is bonded to the front face of the platform. Electrical connection wires connect front contact pads on the chip to the front face of the electrical connection leads. A block of encapsulating material encapsulates the chip and the electrical connection wires on the front of the leadframe and fills the spaces that separate the platform from the electrical connection leads and the spaces between the said electrical connection leads.

If the chip has, on its front face, an integrated optical sensor, the aforementioned encapsulating material is transparent.

In practice, such packages are produced at different points on a large leadframe which, at the end of the fabrication process, is cut up, in particular by a mechanical dicing means, so as to separate the packages.

However, it turns out that some of the packages obtained in this way cannot be used because of the appearance of cracks in the encapsulating material and flaking off of this material, in particular near the electrical connection leads, which result in the electrical connection leads becoming detached and the electrical connection wires fracturing or becoming unsoldered.

There is a need in the art to improve the quality of semiconductor packages with a visible leadframe.

SUMMARY OF THE INVENTION

In accordance with one embodiment of the present invention, a process is presented for fabricating at least one semiconductor package with a flat metal leadframe having spaced apart portions, at least some of which constitute electrical connection leads. An integrated circuit chip is fastened on the front of this leadframe. Electrical connection means electrically connect the chip to the electrical connection leads and the chip is encapsulated on the front of the leadframe.

In accordance with an embodiment of the process, the leadframe is imprisoned in the cavity of an injection moulding mould which has flat opposed walls bearing respectively on at least those edges of the opposed faces of the said spaced apart portions that are adjacent to the spaces that separate them. A filling material is then injected into the cavity so that this filling material fills the spaces that separate the said spaced apart portions of the leadframe in order to obtain a plate. The chip is fastened to the said leadframe and electrically connected to the electrical connection leads. The encapsulant for the chip is formed or fastened on the front of the plate.

In accordance with another embodiment of the invention, the process places the plate provided with the said chip connected to the said leads in an injection moulding mould having a cavity on the front of this plate. Encapsulating material is injected into this cavity so as to constitute the encapsulant. The chip may have, on its front face, an integrated optical sensor and the said encapsulating material is then transparent.

According to another embodiment of the invention, the process fastens an encapsulation lid to the plate provided with the chip connected to the leads. The chip may have, on its front face, an integrated optical sensor and the lid then carries an optical lens facing this optical sensor.

An aspect of the present invention further comprises a semiconductor package comprising a flat metal leadframe having spaced apart portions, at least some of which constitute electrical connection leads. An integrated circuit chip is fixed on the front of this leadframe. Electrical connection means electrically connect the chip to the electrical connection leads. Means for encapsulating this chip are provided on the front of the leadframe.

According to the invention, this package comprises a plate formed from the leadframe and from a filling material which fills the spaces that separate the spaced apart portions of the leadframe. The encapsulation means are attached on the front of the plate.

According to one version of the invention, the encapsulation means comprise an overmoulded block made of an encapsulating material. According to the invention, the chip may have, on its front face, an integrated optical sensor and the encapsulating material is then transparent.

According to one version of the invention, the encapsulation means include an attached lid. According to the invention, the chip may have, on its front face, an integrated optical sensor and the lid then carries an optical lens facing this optical sensor.

In accordance with another embodiment of the invention, a plate comprises a flat metal leadframe having a platform to which an integrated circuit chip can be attached and spaced apart portions, at least some of which constitute electrical connection leads for the to be attached integrated circuit chip. A filling material fills the spaces that separate the spaced apart portions of the leadframe.

In another embodiment, a method comprises providing a flat metal leadframe having a platform to which an integrated circuit chip can be attached and spaced apart portions, at least some of which constitute electrical connection leads for the to be attached integrated circuit chip. Then, filling the spaces that separate the spaced apart portions of the leadframe with a filling material to define a plate for supporting the to be attached integrated circuit chip

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 shows a view from below of a leadframe for a semiconductor package according to the invention;

FIG. 2 shows a step in the fabrication of a plate, in cross section, for a package according to the invention;

FIG. 3 shows a step in the fabrication of a subassembly, in cross section, for a package according to the invention;

FIG. 4 shows a step in the fabrication of a package according to the invention, in cross section;

FIG. 5 shows the package obtained after the fabrication step of FIG. 4, in cross section;

FIG. 6 shows another semiconductor package according to the invention, in cross section; and FIG. 7 shows another semiconductor package according to the invention, in cross section.

DETAILED DESCRIPTION OF THE DRAWINGS

Referring in particular to FIG. 1, it may be seen that a flat metal leadframe 1 comprises, at various spaced apart places 2 distributed in matrix form, perforations 3 for forming, at each place 2, a central square platform 4, radiating electrical connection leads 5 which extend perpendicularly to the sides of the platform 4 and have an inner end located at some distance from this platform and an outer end connected to the rest of the leadframe 1, and linking tabs 6 placed at an angle of about 45° and connecting the corners of the platform 4 to the rest of the leadframe 1.

The platform 4, the electrical connection leads 5 and the linking tabs 6 have, on their rear faces, anchoring recesses 7, 8 and 9.

FIG. 2 shows the leadframe 1 placed in the cavity 10 of an injection moulding mould 11 so that it is imprisoned between the two parts 12 and 13 of this mould. This cavity 10 has two opposed walls 14 and 15 which bear on the opposed faces of the leadframe 1.

A filling material 17, for example a filled epoxy resin, is injected via an injection channel 16 of the mould 11, which material flows towards each place 2 and fills, over the thickness of the leadframe 1 and between the walls 14 and 15 of the mould, the perforations 3 and the anchoring recesses 7, 8 and 9. After the filling material has cured, the demoulding operation is carried out.

Next, the leadframe 1 is stripped of any surplus filling material 17, especially in the region of the injection channels 16, and what is obtained, as shown in particular in FIG. 3, is a plate 18 formed by the perforated leadframe 1 and the filling material 17 that fills, over the thickness of this leadframe 1 and in each place 2, the spaces between the platform 4, the connection leads 5 and the linking tabs 6.

The next fabrication step, shown in FIG. 3, comprises fastening, for example by adhesive bonding, flat integrated circuit chips 19 to the front faces of the platforms 4 and then in placing the electrical connection wires 20 between contact pads 21 provided on the front faces of the chips 19 and the front faces of the electrical connection leads 5, by bonding their ends. A subassembly 22 is thus obtained.

One way in which the subassembly 22 is used will now be described with reference to FIGS. 4 and 5.

As FIG. 4 shows, the subassembly 22 is placed between two parts 23 and 24 of an injection moulding mould 25 having, facing each place 2, a cavity 26 that encloses the chip and the corresponding connection wires.

An encapsulating material is then injected into the cavities 26 so as to obtain, after this encapsulating material has cured and after demoulding, blocks of encapsulating material 27 at each place 22, these blocks respectively encapsulating the chip 19 and the corresponding connection wires 20 on the front of the plate 18.

Next, the plate 18 is cut between the various blocks of encapsulating material 27 so as to obtain, at each place 2, a semiconductor package 28 which comprises a plate portion 18 formed from the platform 4, the electrical connection leads 5 and the filling material 17, and which semiconductor package 28 comprises, on the front of this plate 18, an encapsulating block 27 in which a chip 19 and the electrical connection wires 20 are embedded.

In one version, the chip 19 may include an integrated optical sensor 19a on its front face (see, FIG. 6). In this case, the material constituting the encapsulating block 27 is a transparent material, for example a transparent unfilled epoxy resin.

Another way in which the subassembly 22 is used will now be described with reference to FIG. 6.

In this example, an encapsulation lid 29 is fastened to the front face of the plate 18 and at each place 2, which lid includes an annular lens support 30 whose rear face 31 is adhesively bonded to the front face of the plate 18, in the region of the electrical connection leads 5 and to the outside, this support 30 carrying, in its bore, a lens 32 that faces an integrated optical sensor 19a provided on the front face of the chip 19.

In a version shown in FIG. 7, an annular seal 33 is placed between the annular support 30 and the plate 18, and this support 30 furthermore has an external projecting part 34 extending on the front of the electrical connection leads 5, these leads having an external rear end recess 35. Thus, this projecting part and the electrical connection leads are able to receive a connector or a flat electrical connection cable (not shown).

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor package, comprising:
   a flat metal leadframe having a plurality of spaced apart portions, at least some of which constitute electrically conductive lead portions;
   a leadframe forming a plate comprising an insulating filling material that fills the spaces between each of the spaced apart electrically conductive lead portions of the leadframe in alternating fashion and which extends from one end of the leadframe to an opposite end of the leadframe, said plate having a flat front surface and a flat rear surface extending between the ends of the leadframe;
   an integrated circuit chip fixed on the leadframe between the opposed ends;
   electrical connectors electrically connecting the chip to the electrically conductive lead portions; and
   means for encapsulating the chip, wherein the encapsulation means are attached on the front of the plate.

2. The package according to claim 1, wherein the encapsulation means comprise an overmolded block of an encapsulating material.

3. The package according to claim 2, wherein the chip has, on its front face, an integrated optical sensor and wherein the encapsulating material is transparent.

4. The package according to claim 1, wherein the encapsulation means comprises an attached lid.

5. The package according to claim 4, wherein the chip has, on its front face, an integrated optical sensor and wherein the lid carries an optical lens facing this optical sensor.

6. A leadframe, comprising:
   a flat metal leadframe for an integrated circuit chip having a platform to which the integrated circuit chip can be attached and a plurality of spaced apart portions, at least some of which constitute electrically conductive lead portions to be attached to the integrated circuit chip; and an insulating filling material that fills the spaces between each of the spaced apart electrically conductive lead portions of the flat metal leadframe in alternating fashion and which extend from one end of the flat metal leadframe to an opposite end of the flat metal leadframe so as to form a plate having a flat front surface and a flat rear surface extending between those opposed ends of the leadframe.

7. The leadframe of claim 6 wherein the flat metal leadframe further includes anchoring recesses, the filling material filling the anchoring recesses.

8. The leadframe of claim 6 wherein the filling material is a filled epoxy resin.

9. A semiconductor packaging sub-assembly, comprising:

a perforated flat metal leadframe for, an integrated circuit chip having spaced apart electrically conductive lead portions comprising a central platform and opposed electrically conductive lead portions on either side of the central platform; and an insulating filling material that fills perforations in the flat metal leadframe between the spaced apart electrically conductive lead portions in alternating fashion to produce a plate extending from one edge of the leadframe to an opposite edge of the leadframe, the produced plate having both a front and back surface extending between the edges which is lacking any substantial frontwardly extending projections of the filling material which fills the perforations, wherein the central platform is configured to receive, subsequent to perforation filling, a semiconductor integrated circuit chip.

10. A pre-chip attachment leadframe for receiving a semiconductor integrated circuit, comprising:

a perforated flat metal leadframe having spaced apart electrically conductive lead portions comprising a central platform and opposed electrically conductive lead portions on either side of the central platform; and an insulating filling material that fills perforations in the flat metal leadframe between the spaced apart electrically conductive lead portions in alternating fashion to produce a plate extending from a first edge of the leadframe associated with one set of electrically conductive lead portions to a second opposed edge of the leadframe associated with another set of electrically conductive lead portions, the produced plate from the first edge to the opposite second edge having both a front and back surface extending between the first and second edges that is lacking any substantial frontwardly extending projections of filling material.

* * * * *